(12) United States Patent
Yamaoka et al.

(10) Patent No.: US 8,319,281 B2
(45) Date of Patent: Nov. 27, 2012

(54) SEMICONDUCTOR DEVICE WITH INSULATED GATE FORMED WITHIN GROOVED PORTION FORMED THEREIN

(75) Inventors: Yoshikazu Yamaoka, Ogaki (JP); Satoru Shimada, Hashima (JP); Kazunori Fujita, Gifu (JP); Kazuhiro Sasada, Hashima (JP)

(73) Assignee: Sanyo Electric, Co., Ltd., Moriguchi-shi (JP)

( * ) Notice: Subject to any disclaimer, the term of this patent is extended or adjusted under 35 U.S.C. 154(b) by 737 days.

(21) Appl. No.: 11/965,536

(22) Filed: Dec. 27, 2007

(65) Prior Publication Data
US 2008/0185638 A1 Aug. 7, 2008

(30) Foreign Application Priority Data
Dec. 27, 2006 (JP) .................... 2006-353305

(51) Int. Cl.
 *H01L 29/78* (2006.01)
 *H01L 21/336* (2006.01)
(52) U.S. Cl. ............... 257/334; 257/330; 257/E29.262
(58) Field of Classification Search ............ 257/330, 257/334, E29.262
See application file for complete search history.

(56) References Cited

U.S. PATENT DOCUMENTS

| 5,898,207 A | 4/1999 | Takase et al. |
| 2004/0113203 A1* | 6/2004 | Hshieh et al. ............ 257/330 |
| 2005/0072992 A1* | 4/2005 | Lee et al. ............ 257/288 |
| 2006/0054970 A1* | 3/2006 | Yanagida et al. ........... 257/330 |

FOREIGN PATENT DOCUMENTS

| JP | 200-349289 | 12/2000 |
| JP | 2003-224272 | 8/2003 |

* cited by examiner

*Primary Examiner* — Lynne Gurley
*Assistant Examiner* — Vernon P Webb
(74) *Attorney, Agent, or Firm* — Ditthavong Mori & Steiner, P.C.

(57) ABSTRACT

A semiconductor device capable of inhibiting a fabricating process from complication while inhibiting the dielectric strength voltage of a insulating film from reduction is obtained. This semiconductor device includes a groove portion, an insulating film formed on a surface of the groove portion, a gate electrode and a source impurity region, wherein upper ends of the gate electrode, which are portions in contact with the insulating film, are each located at a position identical with or deeper than the range of an impurity introduced from a surface of a semiconductor substrate with respect to the insulating film in order to form the source impurity region and above a lower surface of the source impurity region.

10 Claims, 8 Drawing Sheets

SEMICONDUCTOR DEVICE WITH INSULATED GATE FORMED WITHIN GROOVED PORTION FORMED THEREIN

CROSS-REFERENCE TO RELATED APPLICATIONS

The priority application number JP2006-353305, Semiconductor Device and Method of Fabricating the Same, Dec. 27, 2006, Yoshikazu Yamaoka Satoshi Shimada, Kazunori Fujita, Kazuhiro Sasada, upon which this patent application is based is hereby incorporated by reference.

BACKGROUND OF THE INVENTION

1. Field of the Invention

The present invention relates to a semiconductor device and a method of fabricating the same, and more particularly, it relates to a semiconductor device having a structure in which a gate electrode is formed in a groove portion and a method of fabricating the same.

2. Description of the Background Art

A semiconductor device having a structure in which a gate electrode is formed in a groove portion is known in general.

The conventional semiconductor device comprises a groove portion formed on a main surface of a semiconductor substrate, a gate insulating film formed on a surface of the groove portion, and a gate electrode filling up the groove portion covered with the gate insulating film, wherein upper ends of the gate electrode, which are portions in contact with the gate insulating film, are each so formed as to have a height lower than the height of a surface of the semiconductor substrate. An oxide film having the same height as that of the surface of the semiconductor substrate is formed on an upper surface of the gate electrode. A screen oxide film is formed on the upper ends of the gate insulating film and the surfaces of the oxide film and the semiconductor substrate. The oxide film and the screen oxide film inhibit an impurity implanted through an ion implantation step from being directly implanted into the gate insulating film. Thus, the dielectric strength voltage of the gate insulating film can be inhibited from reduction.

In the conventional semiconductor device, however, the oxide film and the screen oxide film must be formed in order to inhibit the dielectric strength voltage of the gate insulating film from reduction. Consequently, a fabrication process is disadvantageously complicated.

SUMMARY OF THE INVENTION

A semiconductor device according to a first aspect of the present invention comprises a groove portion formed on a main surface of a semiconductor substrate, an insulating film formed on a surface of the groove portion, a gate electrode so formed as to be in contact with the insulating film in the groove portion, and a source impurity region so formed as to be adjacent to the groove portion, wherein upper ends of the gate electrode, which are portions in contact with the insulating film, are each located at a position identical with or deeper than the range of an impurity introduced from the main surface of the semiconductor substrate with respect to the insulating film in order to form the source impurity region and above a lower surface of the source impurity region.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

Figure 1:
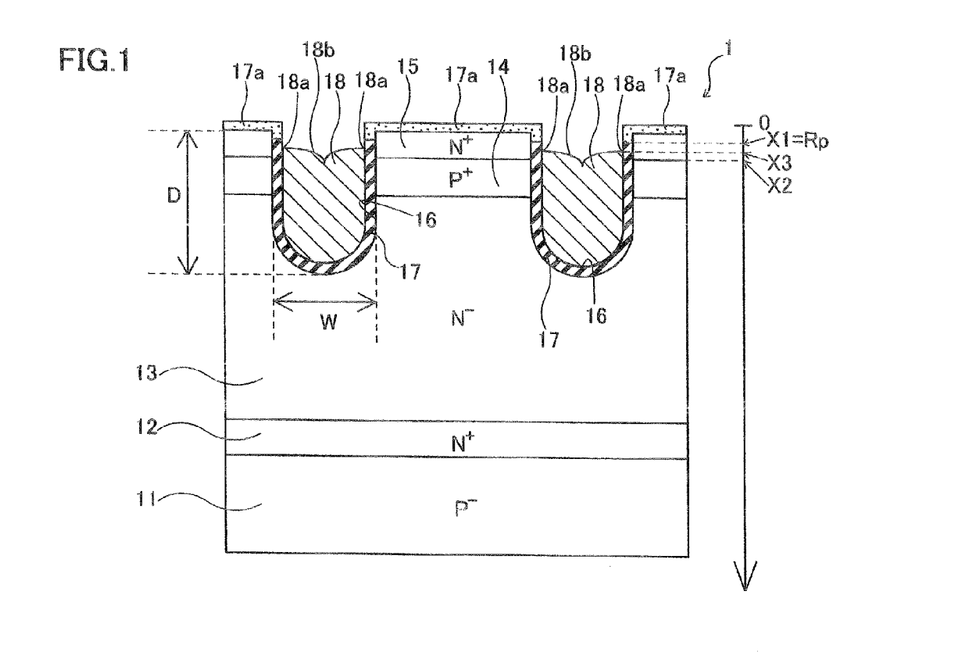
FIG. 1 is a sectional view of a semiconductor device according to a first embodiment of the present invention.

In a semiconductor device 1, an $N^+$-type buried diffusion layer 12 is formed on an upper surface of a $P^-$-type silicon substrate 11, as shown in FIG. 1. An $N^-$-type epitaxial silicon layer 13 constituting a drain region is formed on an upper surface of the $N^+$-type buried diffusion layer 12. A $P^+$-type diffusion layer 14 constituting channel regions is formed on an upper surface of the $N^-$-type epitaxial silicon layer 13. An $N^+$-type source diffusion layer 15 is formed on an upper surface of the $P^+$-type diffusion layer 14.

Groove portions 16 each having a width W of about 0.5 μm and a depth D of about 1 μm are formed so as to pass through the $P^+$-type diffusion layer 14 and the $N^+$-type source diffusion layer 15 to reach the $N^-$-type epitaxial silicon layer 13. A gate insulating film 17 having a thickness of about 1000 nm is formed on surfaces of the groove portions 16 and an upper surface of the $N^+$-type source diffusion layer 15. The gate insulating film 17 is formed on the overall upper surface of the $N^+$-type source diffusion layer 15. A damage region 17a resulting from ion implantation of arsenic (As) described later is formed on the gate insulating film.

The gate electrodes 18 constituted by n-type polysilicon layers fill up the groove portions 16. Upper ends 18a of the gate electrodes 18, which are portions in contact with the gate insulating film 17, are each so formed as to be located at a depth position identical with or deeper than the after-mentioned range X1 ($R_p$) of arsenic ions implanted from the upper surface of the semiconductor device 1 with respect to the gate insulating film 17 in order to form the $N^+$-type source diffusion layer 15 and at a depth position X3 smaller than a depth position X2 of a lower surface of the $N^+$-type source diffusion layer 15. Each of upper surfaces 18b of the gate electrodes 18 is formed such that a center is concave.

Figure 2:
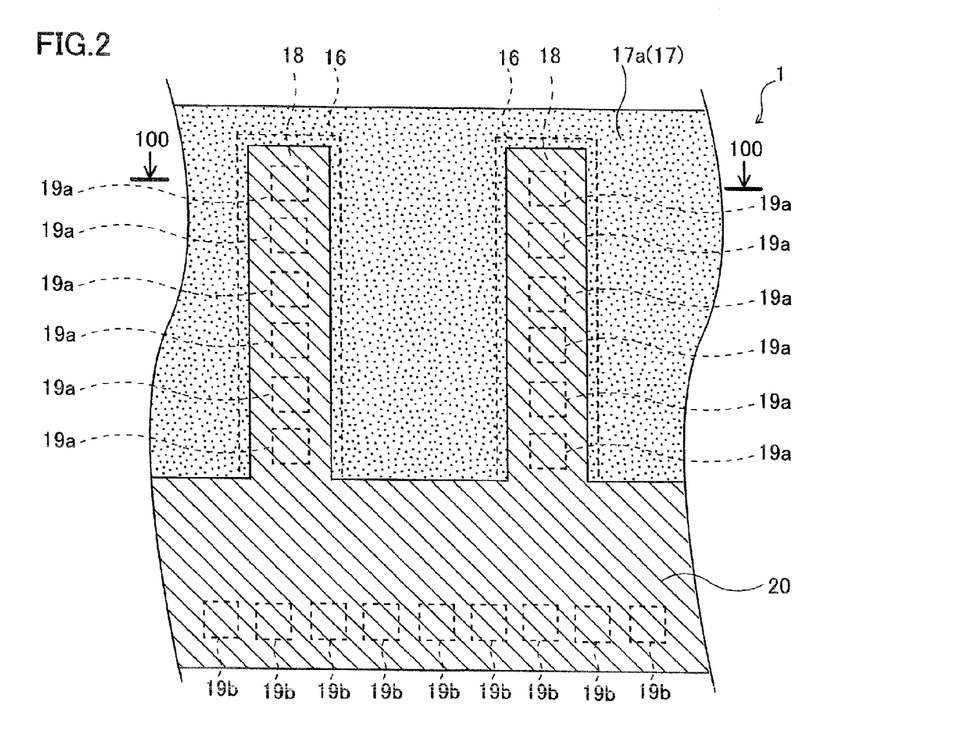
FIG. 2 is a plan view of the semiconductor device according to the first embodiment of the present invention.

As shown in FIG. 2, the gate electrodes 18 (see FIG. 1) filling up a plurality of the groove portions 16 through the gate insulating film 17 respectively are electrically connected to a wiring 20 arranged on an upper surface of the gate insulating film 17 through contact portions 19a or 19b. Thus, a plurality of the gate electrodes 18 are so formed as to be concurrently turned on/off.

Figure 3:
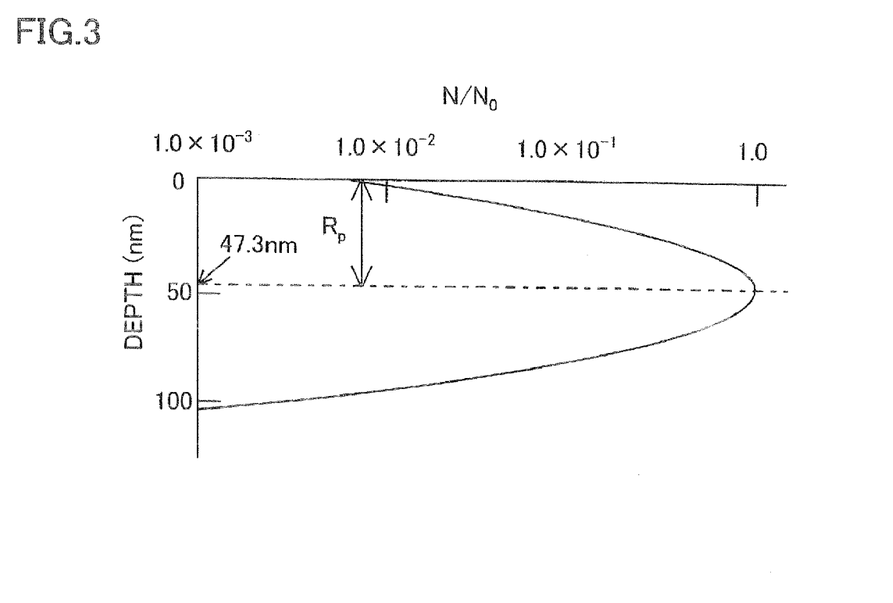
FIG. 3 is a diagram showing distribution of density of an impurity in a substrate when the impurity is implanted into the substrate.

The axis of ordinate in FIG. 3 represents the depth from a surface of $SiO_2$. The axis of abscissas represents normalized impurity distribution ($N/N_0$) The N represents arsenic density in a certain depth, and the $N_0$ represents impurity density in the depth of the range of arsenic ions (Rp=47.3 nm, for example). The impurity density N in a certain depth is divided by the impurity density $N_0$ in the depth of the ion range $R_p$, thereby normalizing the impurity distribution. The density of arsenic gradually increases as the depth from the surface of $SiO_2$ becomes increased, and the arsenic density reaches maximum when Rp=47.3 nm and thereafter decreases as the depth from the surface of $SiO_2$ becomes increased. The impurity distribution is approximately a gaussian distribution (normal distribution) having a bell shape symmetrical with respect to a line of the depth at the maximum impurity density (alternate long and short dash line in FIG. 3).

Figure 4:
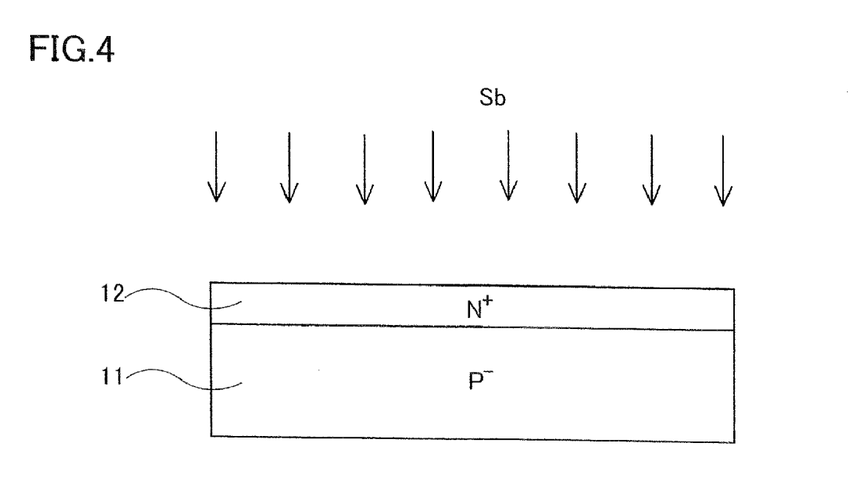
FIGS. 4 to 11 are sectional views for illustrating a process of fabricating the semiconductor device according to the first embodiment of the present invention.

As shown in FIG. 4, antimony (Sb) source is uniformly applied to the surface of the P⁻-type silicon substrate 11 by spin coating. Thereafter the N⁺-type buried diffusion layer 12 is formed by thermal treatment.

Figure 5:
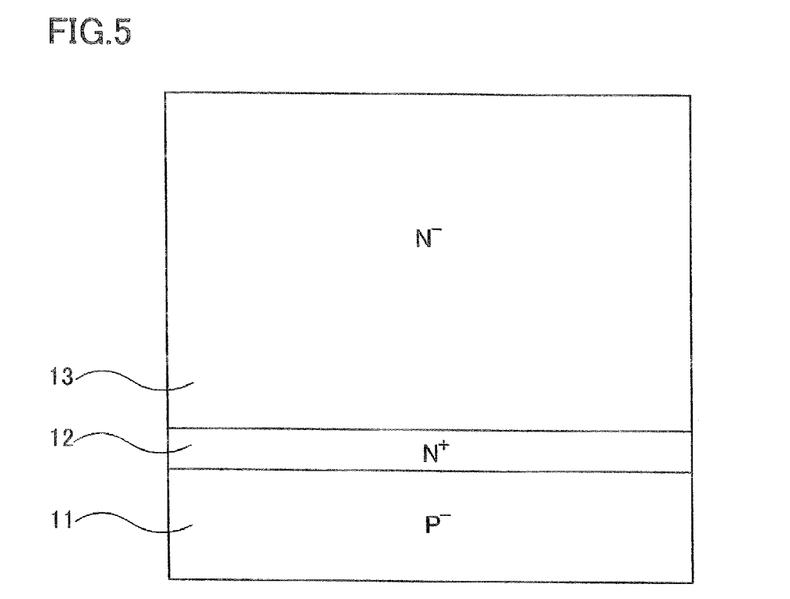

As shown in FIG. 5, a silicon crystal film is deposited and grown with $PH_3$ (phosphine) gas and $SiH_4$ (monosilane) gas, thereby forming the N⁻-type epitaxial silicon layer 13 on the upper surface of the N⁺-type buried diffusion layer 12.

Figure 6:
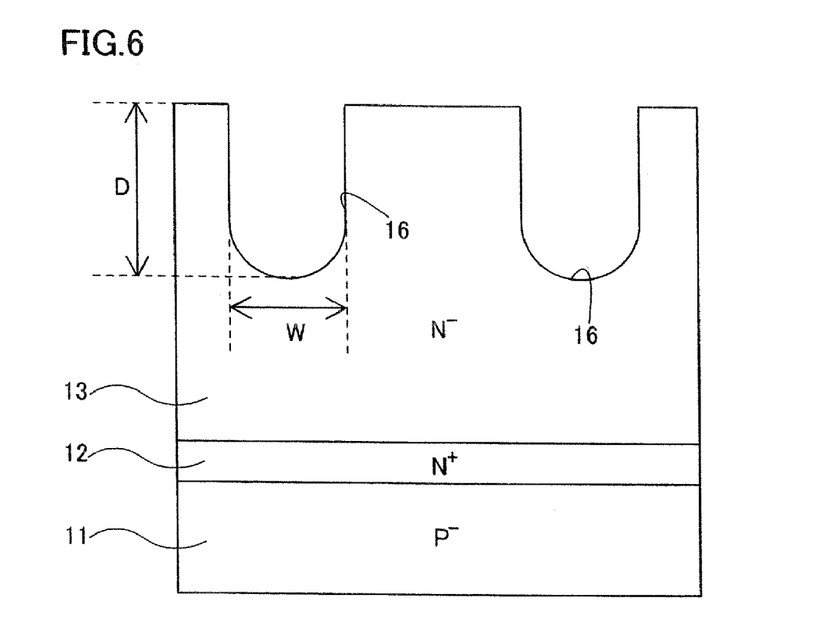

As shown in FIG. 6, the groove portions 16 each having the width W of about 0.5 μm and the depth D of about 1 μm are formed by photolithography and etching.

Figure 7:
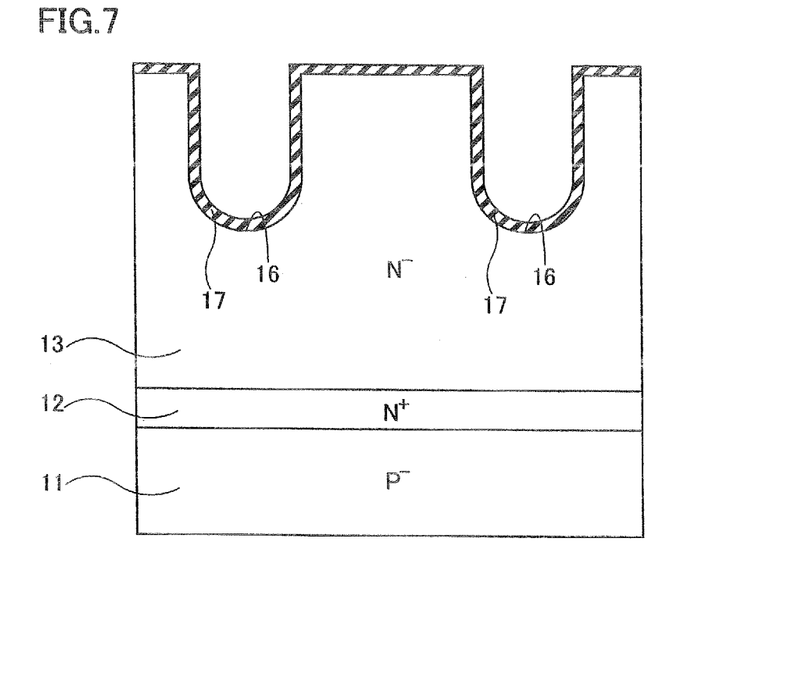

As shown in FIG. 7, a gate insulating film 17 having a thickness of about 10 nm is formed on the upper surface of the N⁻-type epitaxial silicon layer 13 and the surfaces of the groove portions 16 by thermal oxidation.

Figure 8:
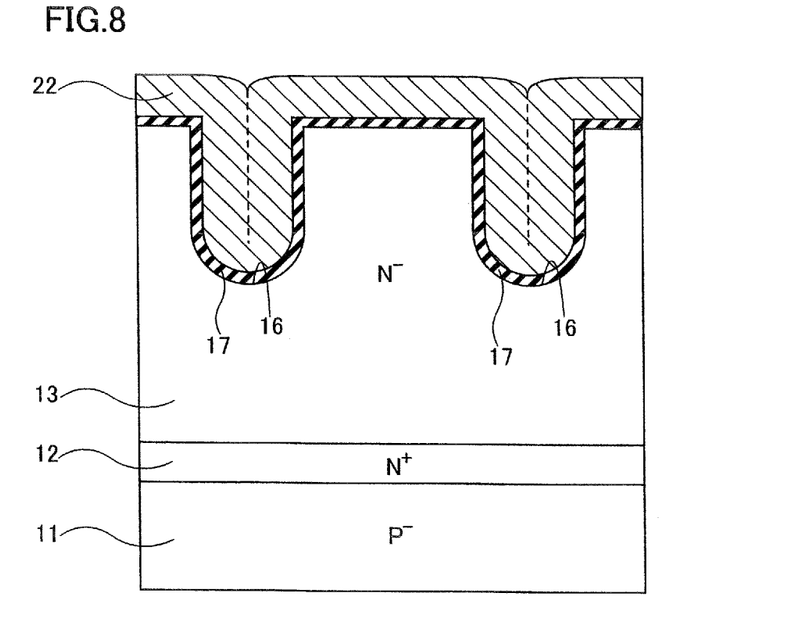

As shown in FIG. 8, a polysilicon layer 22 is formed on the upper surface of the gate insulating film 17 by low pressure CVD. Thus, the polysilicon layer 22 fill up the groove portions 16. The upper surface of the polysilicon layer 22 located above the groove portions 16 is concave. Then an n-type polysilicon layer 22 is formed by being doped with phosphorus (p) by performing thermal treatment after applying $POCl_3$ (phoshporus oxychloride) employed as an impurity diffusing agent to the upper surface of the polysilicon layer 22.

Figure 9:
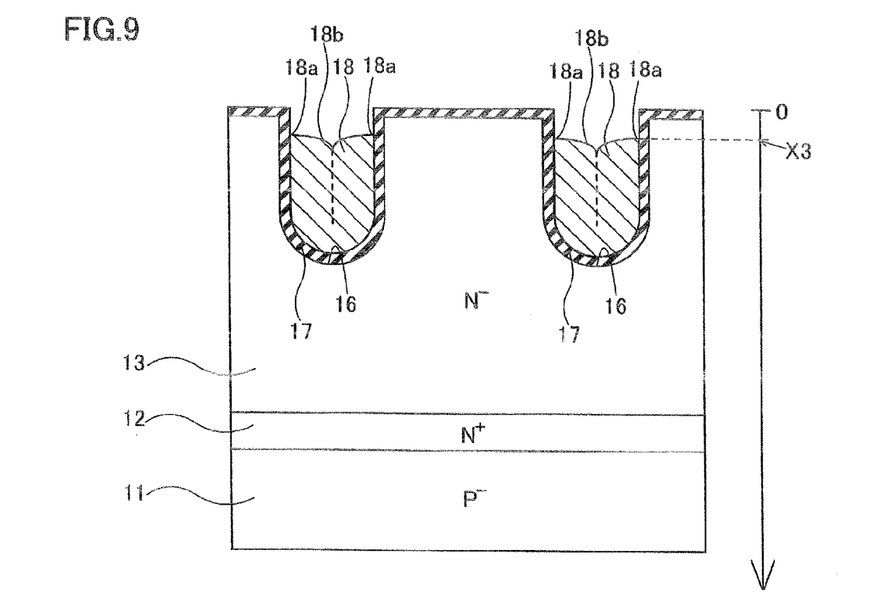

As shown in FIG. 9, the polysilicon layer 22 is anisotropically etched by reactive ion etching (RIE), thereby forming the gate electrodes 18. Centers of the upper surfaces 18b of the gate electrodes 18 are concave by reflecting the shape of the concave upper surface of the polysilicon layer 22.

Figure 10:
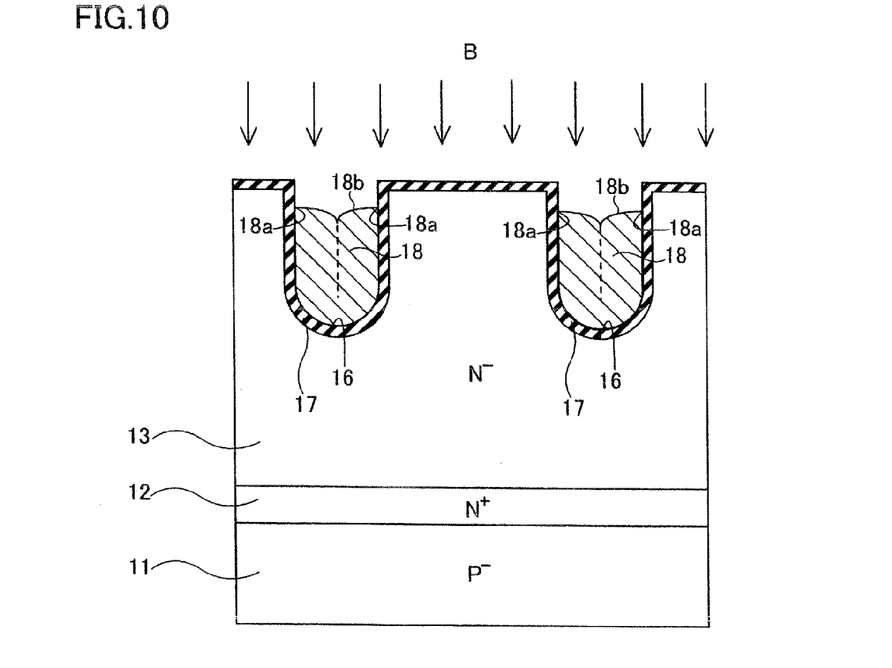

As shown in FIG. 10, boron ions employed as a p-type impurity are implanted into the surfaces of the gate insulating film 17 and the gate electrodes 18.

Figure 11:
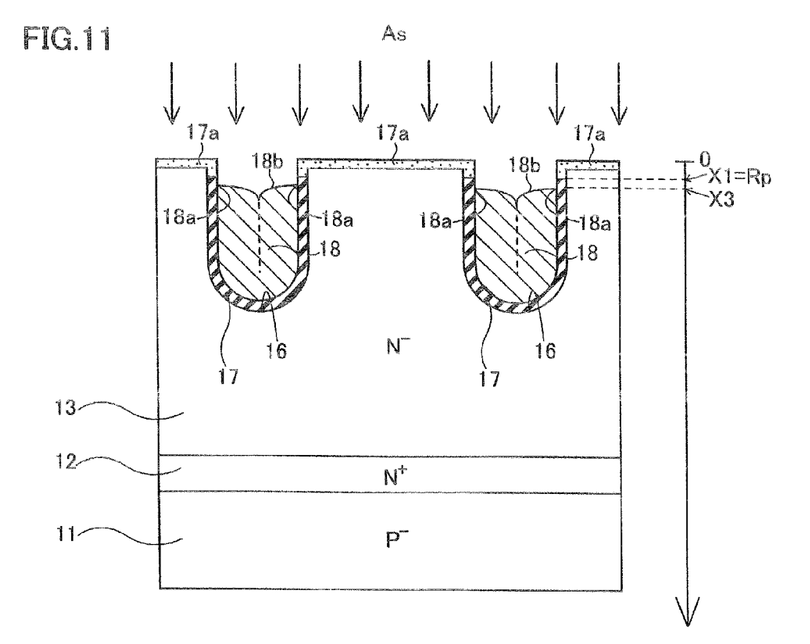

As shown in FIG. 11, arsenic ions employed as an n-type impurity are implanted into the surfaces of the gate insulating film 17 and the gate electrodes 18. At this time, the damage region 17a is formed in the gate insulating film 17 with the implanted arsenic ions. While this damage region of the gate insulating film 17 reaches the depth position of the range X1 of the arsenic ions, the damage region 17a does not reach regions where the gate insulating film 17 and the gate electrodes 18 are in contact with each other. While the range of the boron ions implanted through the process shown in FIG. 10 is larger than that of the arsenic ions implanted through the process shown in FIG. 11, the dope amount of the boron ions is remarkably smaller than the dope amount of the arsenic ions. Thus, the damage of the gate insulating film 17 resulting from the boron ions can be reduced.

The gate electrodes 13 are doped with phosphorus having higher concentration than the boron ions and the arsenic ions. Thus, the influence of the boron ions and the arsenic ions implanted into the gate electrodes 18 can be reduced.

The arsenic ions employed as the n-type impurity and the boron ions employed as the p-type impurity implanted into the N⁻-type epitaxial silicon layer 13 are activated by performing thermal treatment by rapid thermal annealing (RTA). Thus, the N⁺-type source diffusion layer 15 is formed on the upper portion of the N⁻-type epitaxial silicon layer 13 and the P⁺-type diffusion layer 14 is formed on the lower layer of the N⁺-type source diffusion layer 15, as shown in FIG. 1. Thus, the semiconductor device 1 according to the first embodiment is formed.

According to the first embodiment, as hereinabove described, the upper ends 18a of the gate electrodes 18, which are portions in contact with the gate insulating film 17, are each located at the depth position identical with or deeper than the range X1 of the arsenic ions implanted from the upper surface of the semiconductor device 1 with respect to the gate insulating film 17 in order to form the P⁺-type diffusion layer 14 and the N⁺-type source diffusion layer 15. Thus, the ions can be inhibited from being implanted into the portion of the gate insulating film 17, in contact with the gate electrodes 18. Therefore, the portion of the gate insulating film 17, in contact with the gate electrodes 18, can be inhibited from being damaged. The arsenic ions are inhibited from being implanted into the gate insulating film 17 in contact with the gate electrodes 18, whereby the dielectric strength voltage of the gate insulating film 17 can be inhibited from reduction.

According to the first embodiment, the upper ends 18a of the gate electrodes 18, which are portions in contact with the gate insulating film 17, are located on the position X3 above the depth X2 of the lower surface of the N⁺-type source diffusion layer 15. Thus, channels for flowing carriers from the N⁺-type source diffusion layer 15 to the N⁻-type epitaxial silicon layer 13 can be easily formed on the regions where the P⁺-type diffusion layer 14 is in contact with the gate insulating film 17.

According to the first embodiment, the dielectric strength voltage of the gate insulating film 17 can be inhibited from reduction with no process of separately providing another insulating film on the gate insulating film 17 or the like in order to prevent the damage resulting from implantation of the arsenic ions into the gate insulating film 17. Thus, the process of fabricating the semiconductor device 1 can be inhibited from complication.

According to the first embodiment, as hereinabove described, a plurality of the gate electrodes 18 are provided and are electrically connected to each other through the wiring it arranged on the upper surface or the gate insulating film 17. Thus, the gate electrodes 18 can be easily concurrently turned on/off.

According to the first embodiment, as hereinabove described, the impurity concentration of phosphorus of the gate electrodes 18 is larger than the impurity concentration of the N⁺-type source diffusion layer 15 and the impurity concentration of the P⁺-type diffusion layer 14. Thus, the impurity concentration of phosphorus is larger than those of the arsenic ions and the boron ions, and hence the influence of the arsenic ions and the boron ions implanted into the gate electrodes 18 can be reduced.

According to the first embodiment, as hereinabove described, the semiconductor device comprises the P⁺-type diffusion layer 14 and the N⁻-type epitaxial silicon layer 13 under the lower surface of the N⁺-type source diffusion layer 15. The groove portions 16 are so formed as to pass through the N⁺-type source diffusion layer 15, the P⁺-type diffusion layer 14 and the N⁻-type epitaxial silicon layer 13. Thus, the trench gate semiconductor device 1 can be easily formed.

(Second Embodiment)

Figure 12:
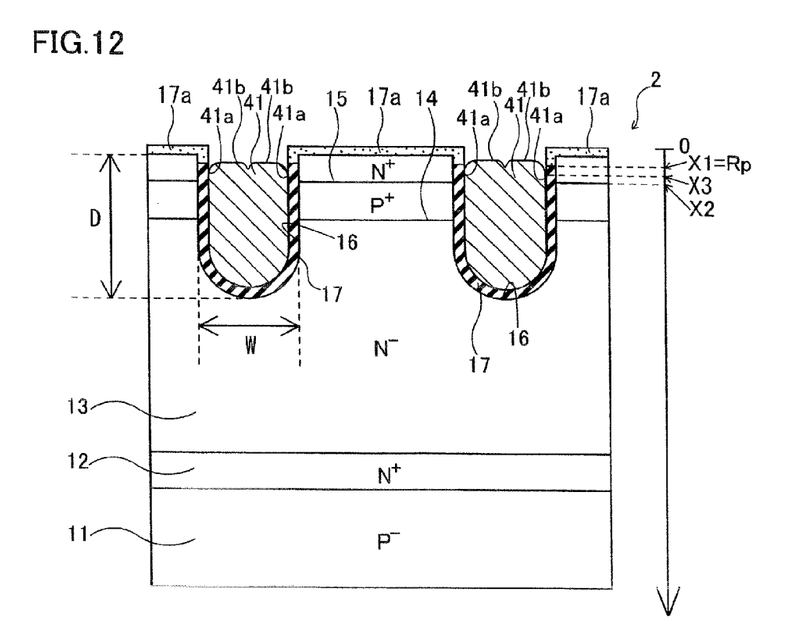
FIG. 12 is a sectional view showing a structure of a semiconductor device according to a second embodiment of the present invention.

In a semiconductor device 2 according to a second embodiment of the present invention, upper ends 41a of gate electrodes 41, which are portions in contact with a gate insulating film 17, each have a substantial arc shape.

In this semiconductor device 2, the upper ends 41a of the gate electrodes 41, which are the portions in contact with a gate insulating film 17, are chamfered, as shown in FIG. 12. Thus, the upper ends 41a each have no angular shape as the upper ends 18a (see FIG. 1) according to the aforementioned first embodiment but the substantial arc shape. Uppermost ends 41b of the gate electrodes 41, which are portions other than the portions in contact with the gate insulating film 17 are arranged at a position higher than the depth of the range X1 of arsenic ions with respect to the gate insulating film 17 and the upper ends 41a are each located at a position X3 identical with or deeper than the range X1. The remaining structure of the semiconductor device according to the second embodiment is similar to that of the semiconductor device according to the first embodiment.

The upper ends 41a of the gate electrodes 41 are formed by etching the gate electrodes 18 with ECR plasma etching apparatus. Argon (Ar) gas is employed for this etching. This etching is performed by utilizing difference in a sputter rate depending on an angle at which argon gas is incident on the gate electrodes 18. The etching is controlled such that the upper ends 41a of the gate electrodes 41, which are the portions in contact with the gate insulating film 17, are etched bore rapidly than the uppermost ends 41b, whereby the upper ends 41a is formed in the substantial arc shape.

According to the second embodiment, as hereinabove described, the upper ends 41a of the gate electrodes 41 are each formed in the substantial arc shape, whereby electric field concentration can be inhibited from occurring in the upper ends 41a of the gate electrodes 41 and hence breakdown can be inhibited from occurring.

According to the second embodiment, as hereinabove described, the uppermost ends 41b of the gate electrodes 41 are each so formed as to be arranged at the position higher than the depth of the range X1 of the arsenic ions with respect to the gate insulating film 17 and the upper ends 41a of the gate electrodes 41 are each so formed as to be located at the position identical with or deeper than the range X1. Thus, portions etched can be reduced as compared with a case where the uppermost ends 41b of the gate electrodes 41 are etched up to the depth identical with or deeper than the range X1 by anisotropic etching or the like. Thus, the semiconductor device 2 in which the portions of the gate insulating film 17 in contact with the gate electrodes 41 are inhibited from being damaged can be fabricated while reducing the time for fabricating the semiconductor device 2.

(Third Embodiment)

Figure 13:
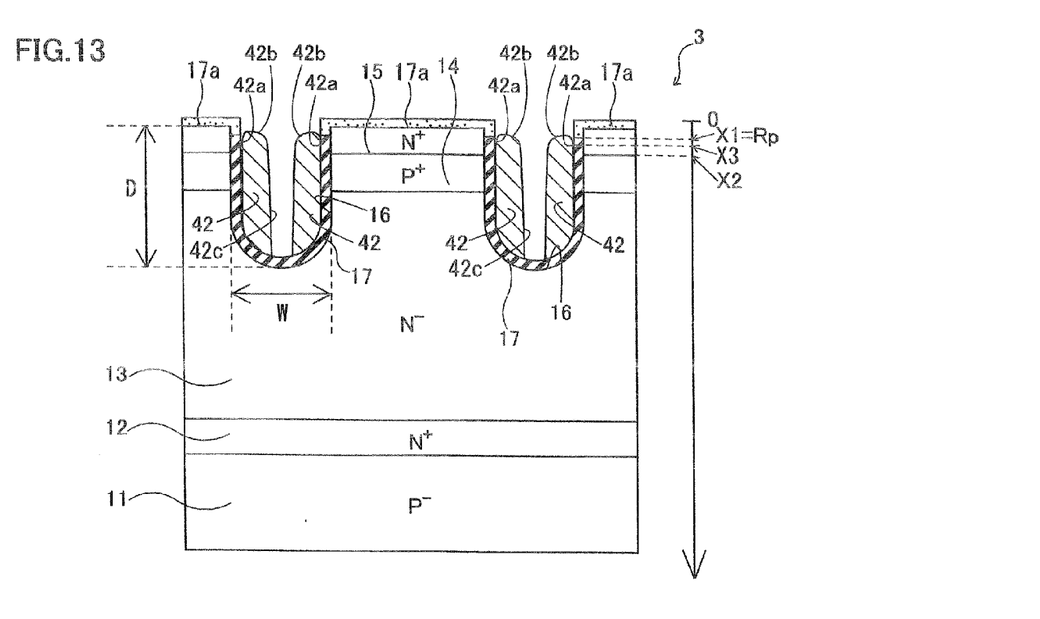
FIG. 13 is a sectional view showing a structure of a semiconductor device according to a third embodiment of the present invention.

In a semiconductor device 3 according to a third embodiment of the present invention, openings 42c are formed in gate electrodes 42.

In this semiconductor device 3, openings 42c reaching the gate insulating film 17 located on bottom surfaces of the groove portions 16 are formed in the gate electrodes 42, as shown in FIG. 13. Uppermost ends 42b which are portions other than the portions in contact with the gate insulating film 17 in the gate electrodes 42 are each arranged at a position higher than the depth of the range X1 of arsenic ions with respect to the gate insulating film 17. The upper ends 42a which are the portions in contact with the gate insulating film 17 in the gate electrodes 42 are each so formed as to be located at a position X3 identical with or deeper than the range X1. The upper ends 42a of the gate electrodes 42 are each formed in a substantial arc shape.

According to the third embodiment, as hereinabove described, the openings 42c are formed in the gate electrodes 42, whereby the contact area between each of the gate electrodes 42 and the gate insulating film 17 are reduced by the area of the openings 42c. Thus, the capacitance of the gate electrodes 42 can be reduced. Thus, the speed of the semiconductor device 3 can be increased and power consumption of the semiconductor devote 3 can be reduced.

Although the present invention has been described and illustrated in detail, it is clearly understood that the same is by way of illustration and example only and is not to be taken by way of limitation, the spirit and scope of the present invention being limited only by the terms of the appended claims.

Figure 14:
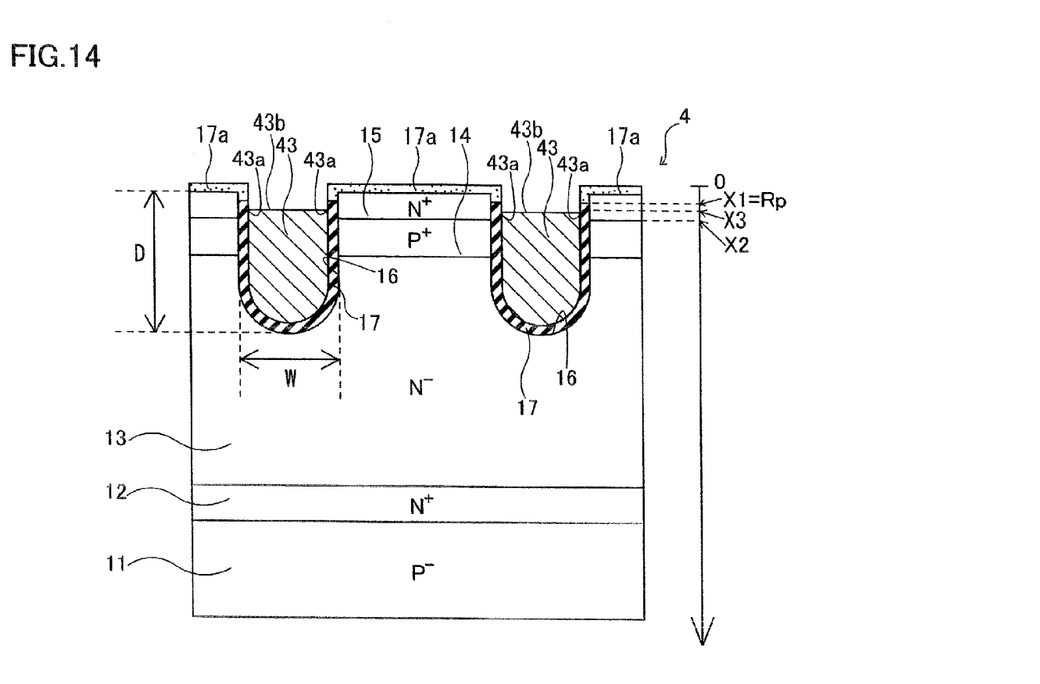
FIG. 14 is a sectional view of a semiconductor device according to a first modification of the first embodiment of the present invention.
Figure 15:
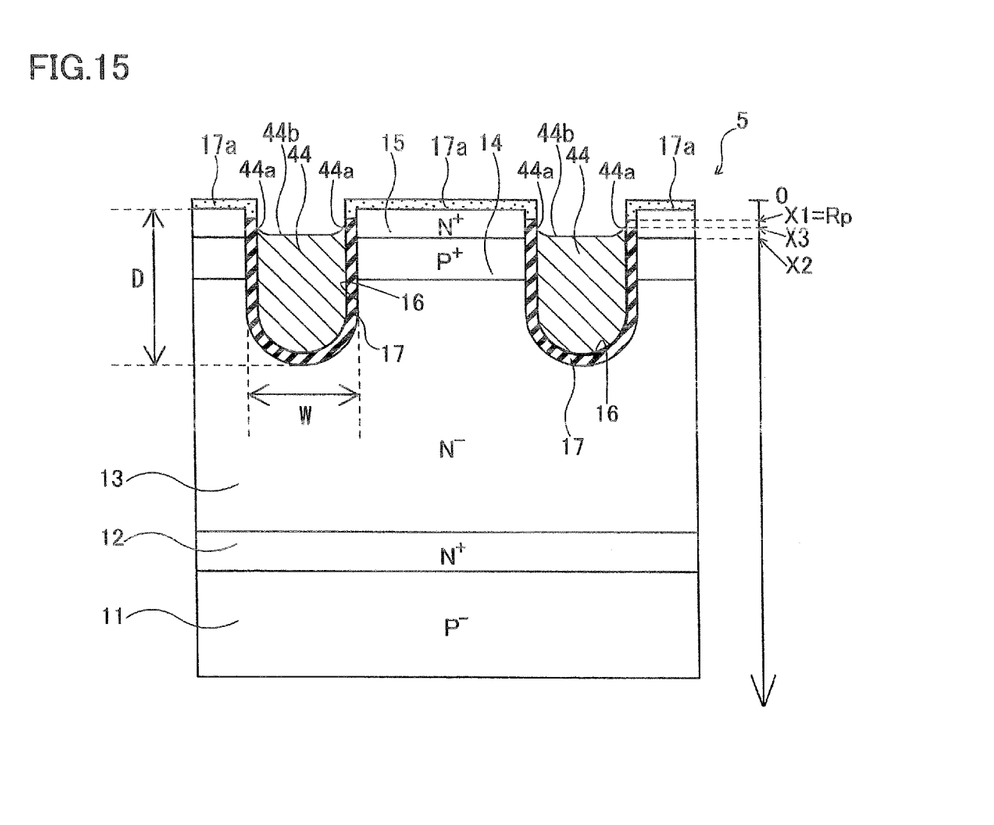
FIG. 15 is a sectional view of a semiconductor device according to a second modification of the first embodiment of the present invention.

For example, while the upper surfaces 18b of the gate electrodes 18 are formed in the concave shape in the aforementioned first embodiment, the present invention is not restricted to this but upper surfaces 43b of the gate electrodes 43 each may be alternatively formed into a flat shape as in a semiconductor device 4 according to a first modification shown in FIG. 14. Alternatively, upper surfaces 44b of gate electrodes 44 each may be formed in a shape swelling up toward portions in contact with the gate insulating film 17 as in a semiconductor device 5 according to a second modification shown in FIG. 15. Also in the semiconductor devices 4 and 5 according to the first and second modifications, the upper ends 43a and 44a of the gate electrodes 43 and 44, which are portions in contact with the gate insulating films 17, are so formed as to be located at depth positions identical with or deeper than the range X1 of arsenic ions implanted from upper surfaces of the semiconductor devices 4 and 5 with respect to the gate insulating films 17 and at positions X3 above position X2 of lower surfaces of the N⁺-type source diffusion layers 15, similarly to the aforementioned first embodiment.

What is claimed is:

1. A semiconductor device comprising:
    a groove portion formed on a main surface of a semiconductor substrate;
    an insulating film formed on a surface of said groove portion;
    a gate electrode so formed as to be in contact with said insulating film in said groove portion;
    a source impurity region so formed as to be adjacent to said groove portion, and
    a drain impurity region so formed as to be vertically adjacent to said source impurity region,
    wherein
    upper ends of said gate electrode, which are portions in contact with said insulating film, are each located at a position identical with or deeper than the range Rp of an impurity introduced from the main surface of said semiconductor substrate with respect to said insulating film in order to form said source impurity region and above a lower surface of said source impurity region, and
    said range Rp is positioned at a depth apart from a depth position of an upper surface of said source impurity region in a depth direction, and said upper ends of said gate electrode, which are the portions in contact with said insulating film, are each positioned between a depth position of said range Rp and a depth position of said lower surface of said source impurity region.

2. The semiconductor device according to claim 1, wherein said upper ends of said gate electrode, which are the portions in contact with said insulating film, each have a substantial arc shape.

3. The semiconductor device according to claim 2, wherein an uppermost end of said gate electrode, which is a portion other than the portions in contact with said insulating film in said gate electrode, is arranged at a position higher than the depth of the range of said impurity with respect to said insulating film, and the portions of said gate electrode, in contact with said insulating film, is located at the position identical with or deeper than said range.

4. The semiconductor device according to claim 1, wherein said gate electrode is formed with an opening reaching said insulating film located on a bottom surface of said groove portion.

5. The semiconductor device according to claim 1, wherein said insulating film formed on the surface of said groove portion is so formed as to extend also to the main surface of said semiconductor substrate outside said groove portion.

6. The semiconductor device according to claim 1, wherein an upper surface of said gate electrode is formed such that a center is concave.

7. The semiconductor device according to claim 1, wherein an upper surface of said gate electrode is formed in a flat shape.

8. The semiconductor device according to claim 1, wherein said upper ends of said gate electrode, which are the portions in contact with said insulating film, are so formed as to be higher than a center of said gate electrode.

9. The semiconductor device according to claim 1, further comprising:
a channel impurity region formed under the lower surface of said source impurity region and constituting a channel region different in conductive type from said source impurity region; and
a drain impurity region formed under the lower surface of said channel impurity region and identical in conductive type with said source impurity region, wherein
said groove portion is so formed as to pass through said source impurity region, said channel impurity region and said drain impurity region.

10. The semiconductor device according to claim 9, wherein
the impurity concentration of said gate electrode is larger than the impurity concentration of said source impurity region and the impurity concentration of said channel impurity region.

* * * * *